United States Patent

Rezek et al.

Patent Number: 5,321,420
Date of Patent: Jun. 14, 1994

[54] OPERATOR INTERFACE FOR AN ELECTRONIC MEASUREMENT SYSTEM

[75] Inventors: John Rezek, Phoenix, Ariz.; Curt Zenigami, Roseville, Calif.; Nancy Ahern, Scottsdale, Ariz.

[73] Assignee: Motorola, Inc., Schaumburg, Ill.

[21] Appl. No.: 8,041

[22] Filed: Jan. 22, 1993

Related U.S. Application Data

[63] Continuation of Ser. No. 691,751, Apr. 26, 1991, abandoned.

[51] Int. Cl.⁵ .............................................. G09G 5/00
[52] U.S. Cl. ..................................... 345/134; 345/146
[58] Field of Search ............. 340/706, 709, 710, 711, 340/712, 722; 324/121 R; 345/134, 145, 146

[56] References Cited

U.S. PATENT DOCUMENTS

| | | | |
|---|---|---|---|
| 3,396,378 | 8/1968 | Keith, Jr. ........................ | 340/711 |
| 4,366,475 | 12/1982 | Kishi et al. ..................... | 340/711 |
| 4,578,640 | 3/1986 | Crooke et al. .................. | 324/121 R |
| 4,634,970 | 1/1987 | Payne et al. ................... | 324/121 R |
| 4,647,915 | 3/1987 | Shank et al. .................... | 340/722 |
| 4,695,833 | 9/1987 | Ogura et al. .................... | 340/706 |
| 4,796,019 | 1/1989 | Auerbach ........................ | 340/712 |
| 4,821,030 | 4/1989 | Batson et al. ................... | 340/712 |
| 4,926,166 | 5/1990 | Fujisawa et al. ................ | 340/784 |
| 4,937,762 | 6/1990 | Todome .......................... | 340/712 |
| 5,056,059 | 10/1991 | Tivig et al. ..................... | 340/712 X |
| 5,081,592 | 1/1992 | Jenq ................................ | 340/721 X |

FOREIGN PATENT DOCUMENTS 0270674  10/1989  Japan ............................... 324/121 R

*Primary Examiner*—Jeffery Brier
*Attorney, Agent, or Firm*—Frank J. Bogacz

[57] ABSTRACT

An electronic measurement system including a zoned display screen and menu selection system controlled by softkeys. A displayed menu item may be selected by pushing the softkey associated with that function. Zones of the display screen may be selected as well as particular data items within each zone. These data items may be read from the display screen and then altered appropriately either by digital input or conventional analog selection by an operator.

13 Claims, 4 Drawing Sheets

OPERATOR INTERFACE FOR AN ELECTRONIC MEASUREMENT SYSTEM

This application is a continuation-in-part of prior application Ser. No. 07/691,751, filed Apr. 26, 1991, now abandoned.

BACKGROUND OF THE INVENTION

The present invention pertains to electronic measurement systems and more particularly to a high efficiency operator interface for communication system analyzers.

Existing electronic measurement systems have a multiplicity of operator interface controls. Typically these systems include many switches and analog twist-knob settings. In using these analyzers, it is often more difficult to set up the input or output characteristics for a test than to execute the test itself. This high level of complexity of such systems renders it very difficult for an operator to learn to use the measurement system and reduces the operator's productivity even after he has gained some level of proficiency.

Cathode ray tube (CRT) displays are often employed by such electronic measurement systems. These CRT displays provide a snapshot of a particular waveform input or output to the measurement system. The CRT display must be interpreted in terms of the data settings of the switches and knobs. It is difficult to coordinate the waveform with the settings of switches and knobs since a number of switches and knobs must be sequentially interpreted to determine the parameters of the particular test and therefore interpret the waveform.

The CRT displays typically depict one feature of the display at a time. Present day electronic measurement systems must be switched from the waveform display mode to the data input/output mode in order to determine the settings of the switches and knobs. This is a severe operator interface limitation.

SUMMARY OF THE INVENTION

In accordance with the present invention, a novel high efficiency operator interface for an electronic measurement system is shown.

An operator interface for a communication system analyzer includes a display screen for simultaneously displaying a number of zones of information relating to a function of the communication system analyzer. The operator interface also includes an input selection arrangement which is coupled to the display screen. The input selection arrangement allows an operator of the communication system analyzer to select one of a plurality of functions supported by the system analyzer. The operator interface lastly includes a controller which is coupled to the display screen and to the input selection arrangement. The controller is responsive to the input selection arrangement to detect the particular function selected by the operator and to control the display screen for displaying the plurality of zones of information relating to the particular function selected by the operator.

DESCRIPTION OF THE PREFERRED EMBODIMENT

Figure 1:
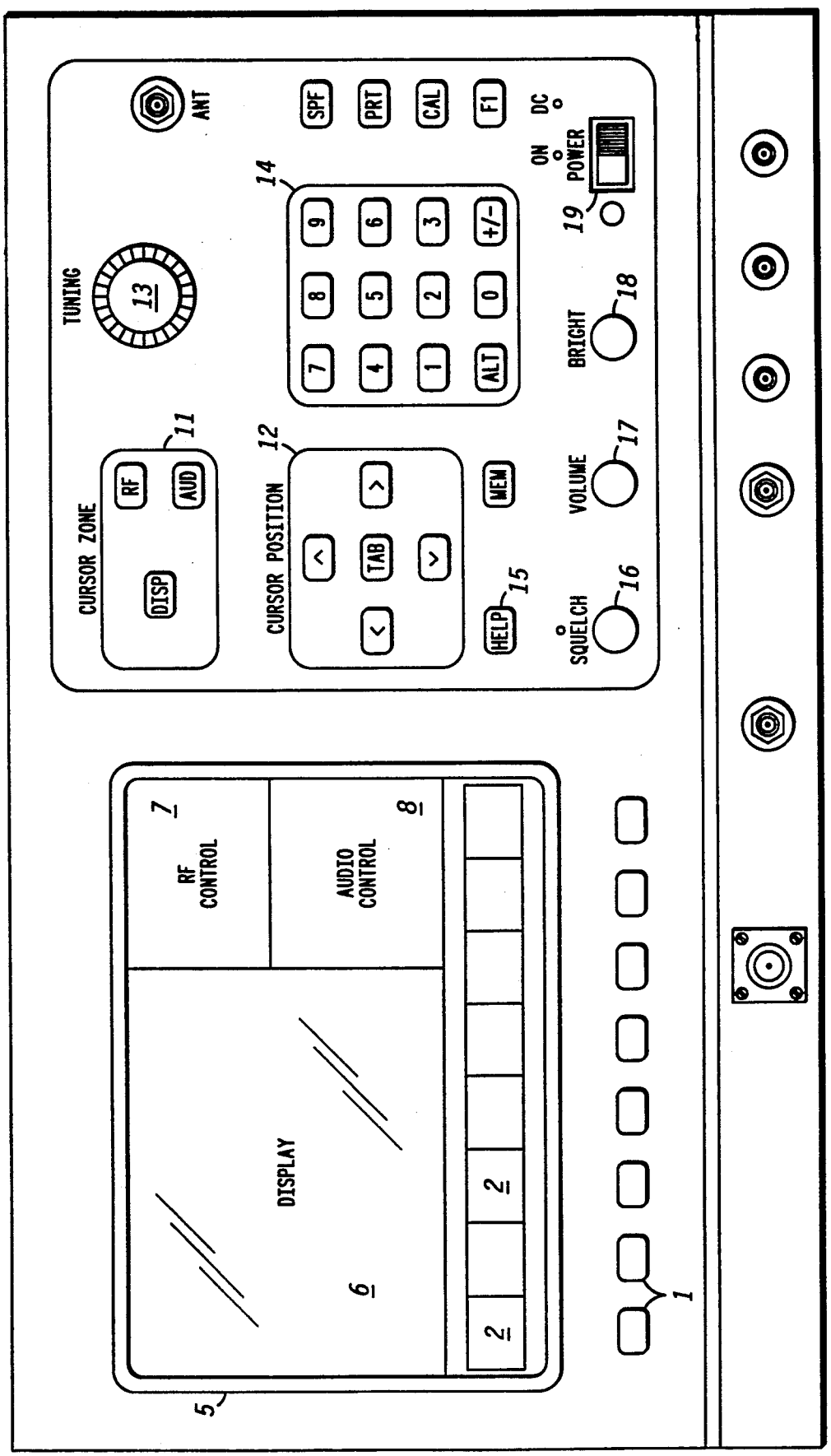
FIG. 1 is the layout of the panel of the communication system analyzer in accordance with the present invention.

Referring to FIG. 1, a layout of the operator interface panel 10 of a communication system analyzer which embodies the present invention is shown.

A number of softkeys 1 are shown horizontally arranged below the CRT display screen 5. The CRT display screen includes the waveform display area 6, (which includes data and waveform display) RF control section 7, audio control section 8, and displayed softkey function labels 2. The softkey function labels 2 which are displayed upon display screen 5 depend upon which of the cursor zone keys 11 that is selected. Each time a cursor zone keys 11 is selected, a menu of all the options associated with that softkey will be displayed upon the softkey function labels 2. Softkeys 1 correspond to the softkey function labels 2. The function displayed by the softkey function label may be selected by pressing the corresponding softkey 1 located below the softkey function label 2. If there are more functions than softkeys, the right most softkey function label 2 will indicate the word "more". This means that more menu selections are available upon pushing the "more" key.

It is to be noted that the CRT display provides four separate "windowed" sections: the waveform and data display section 6 which includes all measured information; an RF control section 7; an audio control section 8 and a display of the selections available by the softkeys 1 as indicated by the softkey function labels 2 at the bottom portion of the CRT display.

In order to access specific cursor zones to select input parameters for sections 6, 7, or 8 of the display screen 5, the cursor zone keys 11 may be used. Selecting one of the cursor zone keys 11 allows the operator to input or change data which is currently displayed on that section of the screen. The particular item within the zone or section must be selected via the cursor position keys 12. When the operator uses the cursor zone keys 11 to change back from the section of screen 5 from which he came, he returns to the same highlighted data entry cursor zone as when that zone was exited. When in a particular zone of display screen 5, the particular data element may be selected by the cursor position keys 12. The cursor position keys include up, down, left, and right keys as well as a tab key which can be used to sequentially move through each of the available selections. Once a particular data element has been selected by the cursor position keys 12, the numerical data may be changed or inserted via the tuning twist-knob 13 (analog) or keypad 14 (digital). Non-numeric entries are made thru the softkey 1 menu selections. The modified data input or control selection is dynamically displayed upon the proper section of display screen 5.

Other controls include a selection of input and output connections located along the bottom of panel 10. A help selection button 15 is included which causes prestored narrative to be displayed upon display screen 5 relative to the selected function previously displayed on the screen. The help may be displayed on the system level or relative to a particular data element which has been previously selected. Other controls include squelch control 16, volume control 17 for the audio, brightness control 18 for the video display, and the power on/off switch 19.

Figure 2A:
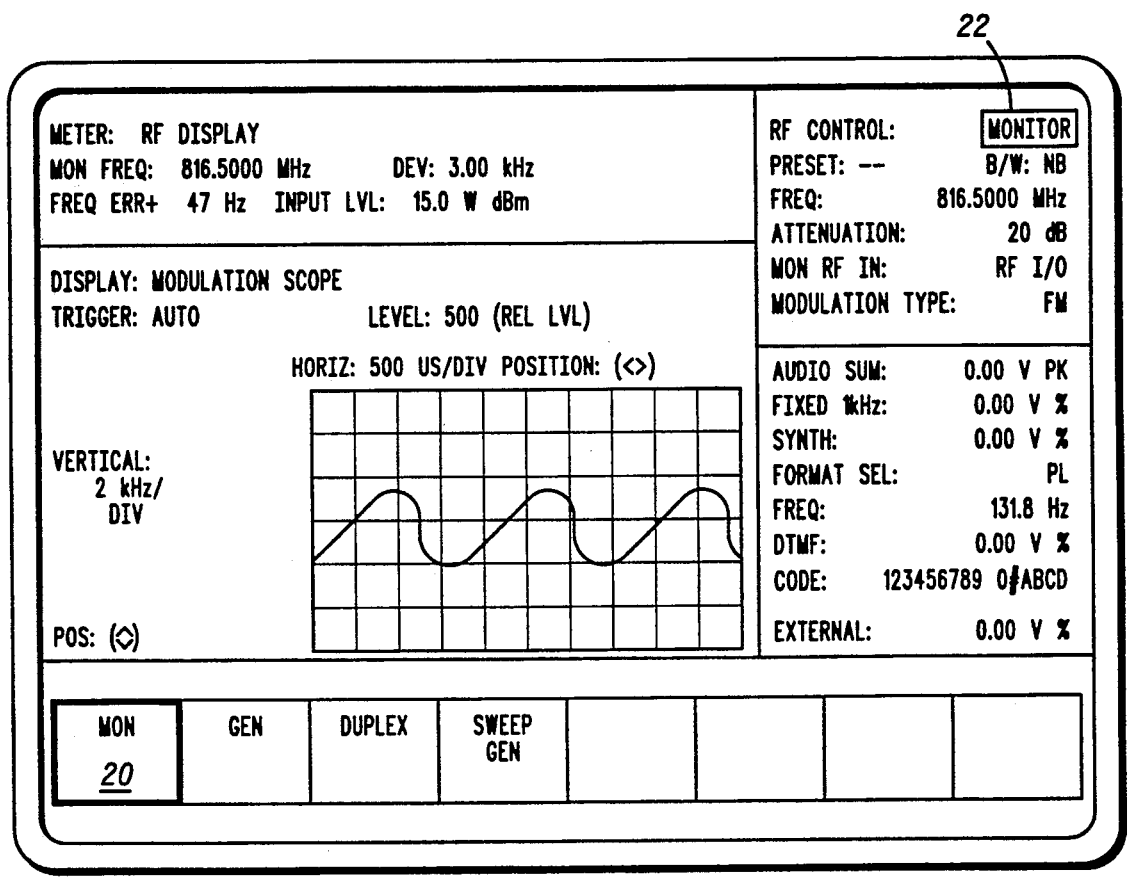
FIG. 2A depicts a layout of a sample display screen in accordance with the present invention.

FIG. 2A depicts a sample display screen 5 layout of the analyzer in the "monitor" mode. Note that the monitor function has been selected by one of the softkeys 1 since the corresponding softkey function label MON is highlighted as having been selected by the bold outlining. The monitor mode provides the communication system analyzer test receiver function which is used in the testing of radio transmitters. In this mode, the analyzer is capable of monitoring RF input through the antenna or direct connection to the transmitter to accurately determine the frequency, power level, and modulation characteristics.

Figure 2B:
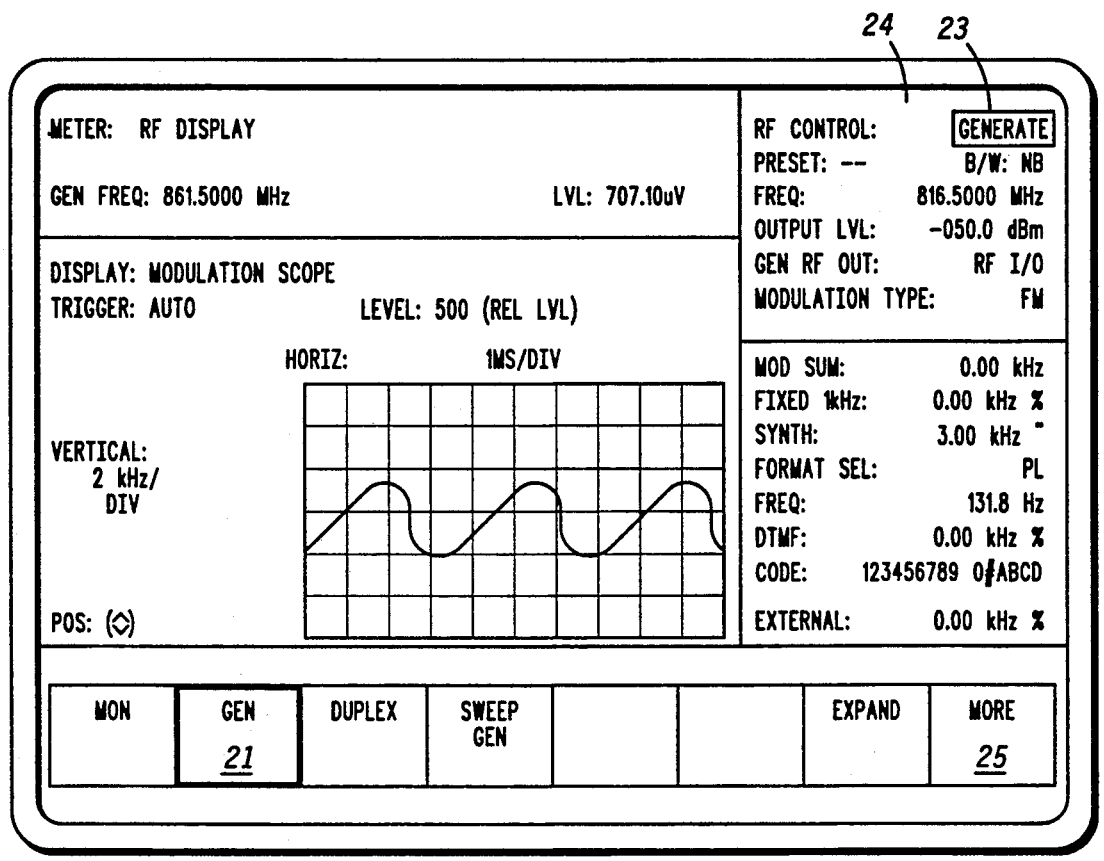
FIG. 2B depicts a layout of a sample display screen in accordance with the present invention.

As can be seen in FIG. 2B, the softkey has been pushed corresponding to the "generate" mode. The display screen softkey function label 21 (GEN) is highlighted. The generate mode configures the analyzer to generate a RF signal at a controllable output level to provide for a wide range of receiver testing. Multiple internal and external modulation signals can be simultaneously impressed on the carrier frequency to generate composite signals. As a result, it can be seen from FIGS. 2A and 2B that the constant windowing function of the analyzer is maintained while various softkey selections are entered. As a result of the various softkey selections, different functions are produced by the analyzer.

Figure 3:
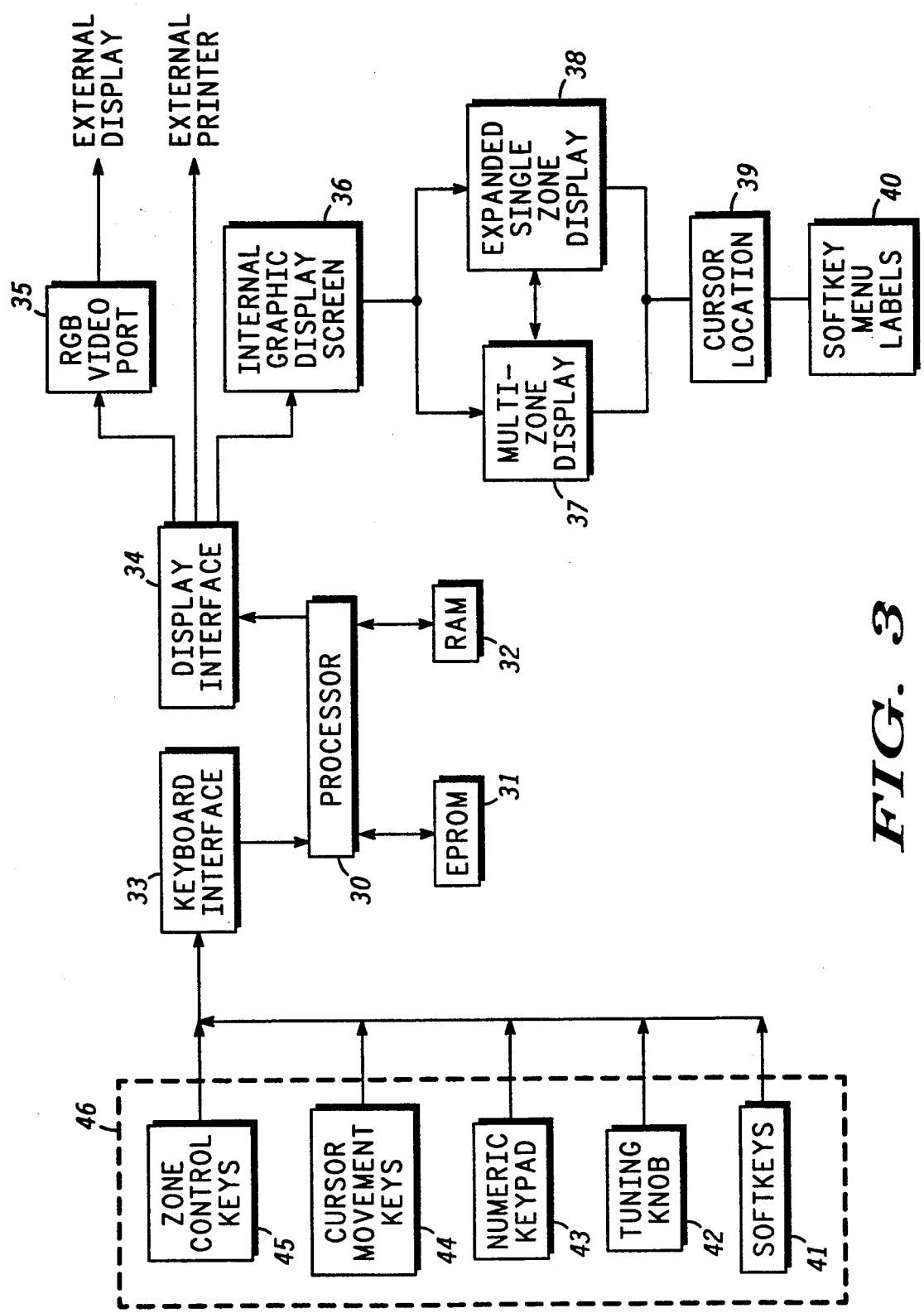
FIG. 3 is a block diagram of the control section for the operator interface shown in FIG. 1 in accordance with the present invention.

Referring to FIG. 3 a block diagram of the control portion of the system analyzer is shown. The operator interface is controlled by processor 30. Processor 30 is connected to electronically programmable read only memory (EPROM) 31. Any read only type memory may be employed, such as ROM read only memory, EPROM, PROM (programmable read only memory, etc.). Processor 30 is also connected to random access memory (RAM) 32. Keyboard interface 33 is connected to processor 30 and provides input to processor 30 and provide for controlling the output of processor 30 including external printer and screen displays. Display interface 34 is also connected to processor 30. Processor 30 interfaces to each of the displays through the display interface 34.

Display interface 34 is connected to red, green, blue (RGB) video port 35. Display interface 34 is also connected to internal graphic screen display 36.

The graphics control section includes internal graphic display screen 36, multi-zone display 37, expanded single zone display 38, cursor location 39, and softkey MENU labels 40. These graphic control section elements include the necessary software logic operating through processor 30 to produce the screen displays shown in FIGS. 2A and 2B. Internal graphic screen display 36 can generate either the multi-zone display 37 or the expanded single-zone display 38. Softkey control switches the display between the multi-zone display 37 and the expanded single-zone display 38. Both multizone display 37 and expanded single-zone display 38 provide specific cursor locations, block 39. Each cursor location produces a set of softkey menu labels, block 40.

Keyboard interface 33 is connected to the operator control panel elements interfaces 46. The operator control panel interfaces 46 includes the following input devices: zone control keys interface 45 (including keys 11 as shown in FIG. 1); cursor movement keys 44 (including keys 12 as shown in FIG. 1); numeric keypad interface 43 (including keys 14 as shown in FIG. 1); tuning knob interface 42 (including control knob 13 as shown in FIG. 1); and softkeys interface 41 (including keys 1 as shown in FIG. 1). The softkeys 41, tuning knob 42, numeric keypad 43, cursor movement keys 44, and zone control keys 45 interfaces are each connected to keyboard interface 33.

To explain the operator interface for the communication system analyzer embodying the present invention, FIGS. 1, 2A, 2B, and 3 will be utilized in a collective fashion. An example will best serve to illustrate the operation of the operator interface and display. When the left most softkey 1 of FIG. 1 is pushed, the corresponding softkey label 2 will be highlighted as shown by block 20 in FIG. 2A. The "MON" function has been selected. This corresponds to the monitor mode. The monitor mode provides the communication system analyzer's test receiver function which is used in the testing of radio transmitters.

When softkey 1 is pushed, the softkeys block 41 is given control. This block determines the identity of the softkey 1 which has been pushed. This information is transmitted from softkeys interface, block 41 through keyboard interface 33 to processor 30. Softkey labels are determined by the cursor zone selected. Pressing the MON softkey causes the processor 30 to put the analyzer into the MON mode. This may generate a different configuration of the display screen 5 in other zones. Processor 30 also highlights the softkey label MON 20 as shown in FIG. 2A by the bold outlining. The operating programs are resident in EPROM 31 and permits processor 30 to control each of the functions. RAM 32 provides working memory for processor 30 to store the present screen parameters and selections available.

In response to the selection of the "MON" softkey, processor 30 determines that the display screen 5 including display area 6, RF control 7, audio control 8, and softkey labels 2 is to be displayed as shown in FIG. 2A. Processor 30 calculates the particular waveforms with its associated parameters as well as other displayed data and transmits for display these parameters and waveform through display interface 34, through internal graphic display screen 36 to the multi-zone display 37. Multi-zone display 37 sets up the display as shown in FIG. 2A. This display includes a configuration of data displays and cursor locations within each zone or window, which is appropriate for the "Monitor" function of the unit. For each such cursor location 39, the processor 30 generates a unique set of softkey labels 40. Within the display, the processor 30 activates a particular zone for data entry by virtue of operator input instructions received thru the zone control keys 45. In the example shown in FIG. 2A, this is the RF control zone 7. The monitor function is highlighted as shown in FIG. 2A by box 22. This indicates that the cursor is in the RF control zone 7 of the display. Softkey labels for a given cursor location do not change as different softkeys are pressed.

If the second softkey 1 from the left is pushed, the generator function is selected as shown in FIG. 2B. Softkeys 41 transmits the identity of the selected softkey through keyboard interface 33 to processor 30. Processor 30 then determines the contents of the display screen 5. The information to form display screen 5 is transmitted from processor 30 through display interface 34, through inter graphic display screen 36 to multi-zone display screen 37. The display screen 5 then appears as shown in FIG. 2B. Note the changes to zones 6, 7, and 8 of the display screen 5 as compared with FIG. 2A. Zone 7 now contains the generate RF control function 23. In addition, the softkey label "GEN" 21 is now highlighted as shown in FIG. 2B by the bold outlining. The generate mode configures the analyzer to produce an RF signal at a controllable output level to provide for a wide range of receiver testing.

Zone control keys 45 is initiated by one of the cursor zone keys 11 of FIG. 1 being pushed. The identity of the key which has been selected is transmitted through keyboard interface 33 to processor 30. Processor 30 determines which zone, 6, 7, or 8, of the screen is to be activated and transmits this information through display interface 34, display screen 36, to the multi-zone display 37. When a particular zone of the display screen 5 has been selected, cursor movement keys 44 allow selection of each particular (data item) function within that zone. For example, referring to FIG. 2A, zone 7 permits selection of the RF control function, a preset state, a bandwidth, an actual frequency, an attenuation factor, an RF input port selection and a modulation type. The cursor movement keys 12 of FIG. 1 allow the cursor movement keys interface 44 to transmit cursor movement instructions to the processor 30. Processor 30 then selects the appropriate cursor position within the activated zone of the multi-zone display 37 and causes display screen 5 to reflect this change.

When a particular parameter has been selected, for example, the frequency of the signal to be generated by the analyzer, data item 24 of FIG. 2B, the frequency 24 may be adjusted in one of two ways. The numeric keypad 14 may be selected and the information input through numeric keypad interface 43, through keyboard interface 33 to processor 30. Processor 30 then causes the appropriate change in frequency to be displayed on zone 7 of display screen 5 by transmitting the appropriate frequency to multi-zone display 37 via the path mentioned above. In addition, a frequency 24 as shown in FIG. 2B may be adjusted by turning tuning knob 13 as shown in FIG. 1. In response to the tuning knob 13, tuning knob interface 42 transmits the adjusted frequency information through keyboard interface 33 to processor 30. Processor 30 determines the new frequency and causes it to be displayed via multi-zone display 37 via the above-mentioned path.

If the second softkey from the right is depressed corresponding to the expand function as shown in FIG. 2B, the softkey interface 41 transmits the identity of the softkey through keyboard interface 33 to processor 30. Processor 30 then transmits the screen information through display interface 34, internal graphic display screen 36, to expanded signal zone display 38. If the cursor zone corresponding to zone 6, the display section, was selected, the waveform shown in FIG. 2B would be expanded to fill the entire display screen 5. That is, zones 7 and 8 of the display screen 5 would no longer be shown. The three-sectioned screen may then be recovered by again depressing a softkey corresponding to the "return" function.

In order to connect an external monitor, RB video port 35 provides an interface between processor 30 and display interface 34 to enable the screen information to be transmitted to an external display. Display interface also provides for a screen display printout to an external printer.

When the cursor zone is moved from zone 6 to 7 to 8 and back to zone 6, the system analyzer remembers the particular position of the cursor within zone 6 and upon return to zone 6, the cursor is again set at the position it was located when zone 6 was exited. When the right most softkey label 25, as shown in FIG. 2B, contains the word "more", it is an indication that additional menu labels (sub-functions) are included under this selected function. These additional sub-function menu selections may be initiated by pushing the softkey 1 corresponding to the "more" selection.

The key elements of the communication system analyzer include: a display screen organized into functional windows (zones); cursor oriented entries; softkey menus; and selectable high level zone movements on the display screen. These elements provide the communication system analyzer with the following features: discrete controls; a CRT display with integrated discrete controls; a CRT display including key intensive digital controls; and a CRT display with integrated softkey menus. The elements and features provided by the system analyzer result in a communication system analyzer which is low in cost, reliable, and easy and efficient to operate.

Although the preferred embodiment of the invention has been illustrated, and that form described in detail, it will be readily apparent to those skilled in the art that various modifications may be made therein without departing from the spirit of the invention or from the scope of the appended claims.

What is claimed is:

1. An operator interface for an electronic measurement system, said operator interface comprising:
    means for simultaneously displaying a plurality of zones of information relating to a particular function of said electronic measurement system;
    softkey means coupled to said means for simultaneously displaying, said softkey means providing for selection of one of a plurality of said particular functions by an operator of said electronic measurement system; and
    control means coupled to said means for simultaneously displaying and to said softkey means, said control means responsive to said softkey means to detect said particular function selected by said operator and to control said means for simultaneously displaying to display said plurality of said zones of information relating to said particular function selected by said operator;
    said control means including screen control means for simultaneously transmitting alphanumeric information, a waveform display and softkey selection information to said means for simultaneously displaying;
    said means for simultaneously displaying operating to display said alphanumeric information, said waveform display and said softkey selection;
    means for selecting coupled to said control means, said means for selecting providing a plurality of inputs to said control means, said plurality of inputs relating to said plurality of zones of information of said selected function;
    said control means operating in response to said plurality of inputs to display said zones of information on said means for simultaneously displaying;
    said means for selecting including:
        zone control input means coupled to said control means and to said softkey means, said zone control input means for selecting one of said plurality of said zones of information selected by said operator
        cursor movement input means coupled to said control means, said cursor movement input means indicating selection of an individual data element of said alphanumeric information within said selected zone of information and transmitting said selected data element to said control means;

said means for simultaneously displaying custom softkey information based upon said selections of said zone control input means and said cursor movement input means numeric keypad input means coupled to said control means, said numeric keypad input means for inputting digital data to said control means for modifying said selected data element; and analog tuning means coupled to said control means, said analog tuning means for inputting analog data to said control means for modifying said selected data element.

2. An operator interface for an electronic measurement system as claimed in claim 1, said means for selecting further includes control means for highlighting said selected data element for modification by said operator.

3. An operator interface for an electronic measurement system as claimed in claim 2, wherein said control means further operated to modify said selected data element and for transmitting said digital data to said means for simultaneously displaying.

4. An operator interface for an electronic measurement system as claimed in claim 2, wherein said control means further operated to modify said selected data element with said analog data and for transmitting said analog data to said means for simultaneously displaying.

5. An operator interface for an electronic measurement system as claimed in claim 1, wherein said softkey means includes:

a plurality of key input means coupled to said control means, each of said plurality of key input means for transmitting an identity of one selected function of said plurality of functions to said control means; and said control means responsive to said identity of said particular function to transmit a plurality of sub-functions for display on said means for simultaneously displaying.

6. An operator interface for an electronic measurement system as claimed in claim 1, wherein said means for simultaneously displaying includes means for individually displaying one of said plurality of said zones of information to provide increased visual detail of said one displayed zone, said means for individually displaying being coupled to said control means.

7. An operator interface for an electronic measurement system as claimed in claim 1, wherein there is further included means for providing an external display, said means for providing an external display being coupled to said control means.

8. An operator interface for an electronic measurement system as claimed in claim 1, wherein there is further included means for interfacing to an external printer, said means for interfacing being coupled to said control means.

9. An operator interface for an electronic measurement system as claimed in claim 1, wherein said control means includes:

processor means for accepting input from said softkey means and from said means for selecting, said processor means for providing output to said means for simultaneously displaying;

first memory means for storing operating program of said operator interface, said first memory means being connected to said processor means;

second memory means for storing working data of said zones of information, said second memory means being connected to said processor means;

keyboard interface means coupled between said processor means and said softkey means and means for selecting; and display interface means connected between said processor means and said means for simultaneously displaying.

10. An operator interface for an electronic measurement system as claimed in claim 9, wherein said processor means includes microprocessor means.

11. An operator interface for an electronic measurement system as claimed in claim 9, wherein:

said first memory means includes read only memory means; and said second memory means includes random access memory means.

12. An operator interface for an electronic measurement system, said operator interface comprising:

means for simultaneously displaying a plurality of zones of information relating to a particular function of said electronic measurement system; and control means coupled to said means for simultaneously displaying, said control means for controlling said means for simultaneously displaying to simultaneously display said plurality of zones of said information;

said control means including screen control means for simultaneously transmitting alphanumeric information, a waveform display and softkey selection information to said means for simultaneously displaying for visual display for said operator; and said means for simultaneously displaying operating to display said alphanumeric information, said waveform display and said softkey selection visually for said operation;

input means coupled to said control means and to said means for simultaneously displaying, said input means for transmitting an operator's selection of at least one of a plurality of functions of said electronic measurement system to said control means; and said control means for controlling said means for simultaneously displaying to display said selected function;

said input means including:

said input means includes softkey means coupled to said control means and to said means for simultaneously displaying, said softkey means for selecting one of a plurality of functions of said electronic measurement system by said operator and alternatively selecting one of a plurality of sub-functions of said communication system analyzer;

cursor control means coupled to said control means, said cursor control means for facilitating selection of said functions of said communication analyzer by said operator;

data input means coupled to said control means, said data input means for transmitting digital and analog data representing said alphanumeric information, said waveform display and said softkey selection information from said operator to said control means; and said control means for storing said digital and analog data and for displaying said digital and analog data on said means for simultaneously displaying.

13. An operator interface for an electronic measurement system as claimed in claim 12, wherein said control means includes:

processor means; and memory means coupled to said processor means.

* * * * *